United States Patent
Kirby

[11] 4,095,198
[45] June 13, 1978

[54] IMPEDANCE-MATCHING NETWORK
[75] Inventor: Thomas J. Kirby, Hillsboro, N.H.
[73] Assignee: GTE Sylvania Incorporated, Stamford, Conn.
[21] Appl. No.: 763,820
[22] Filed: Jan. 31, 1977
[51] Int. Cl.² ............................................. H03H 7/38
[52] U.S. Cl. ...................................... 333/32; 323/76; 323/80
[58] Field of Search ............................. 323/74, 76, 80; 333/17 M, 32; 334/47, 65; 343/860, 861

[56] References Cited
U.S. PATENT DOCUMENTS

| 3,509,500 | 4/1970 | McNair et al. | 333/17 M |
| 3,794,941 | 2/1974 | Templin | 333/17 M |
| 3,906,405 | 9/1975 | Kommrusch | 333/32 X |
| 3,995,237 | 11/1976 | Brunner | 333/32 X |

OTHER PUBLICATIONS
Neumann & Port, "Programmable Antenna-Tuning Unit & its Use with Shortwave Transmitter sk 1/39", News from Rohde & Schwarz, No. 46, vol. 11, 1971, pp. 21–24.

Primary Examiner—A. D. Pellinen
Attorney, Agent, or Firm—Peter Xiarhos

[57] ABSTRACT

An impedance-matching network for impedance-matching a generator to a load over a wide range of frequencies and impedances. The network includes a first pair of busses across which a plurality of capacitors may be selectively connected to achieve an overall desired value of capacitance for the network, and a second pair of busses across which a plurality of inductors may be selectively connected to achieve an overall desired value of inductance for the network. The network may be controlled so that the capacitance and inductance elements may be arranged with respect to each other and the generator and load in any one of four possible L-type configurations or topologies.

13 Claims, 9 Drawing Figures

IMPEDANCE-MATCHING NETWORK

BACKGROUND OF THE INVENTION

The present invention relates to an impedance-matching network and, more particularly, to an impedance-matching network which can be rapidly, electronically controlled to any one of several possible L-type configurations for impedance-matching a generator to a load over a wide range of frequencies.

Impedance-matching networks for impedance-matching sources to loads are generally well known to those skilled in the art. One well-known type of impedance-matching network includes a plurality of discrete circuits corresponding to a like plurality of frequencies and impedances to which a generator source impedance is to be matched. While this type of impedance-matching network is generally useful, it is limited to load matching transformations over a relatively narrow matched bandwidth. Thus, as the possible operational range of the included frequencies or terminating loads increases, the required number of discrete circuits rises rapidly to a prohibitively large number.

Another well-known type of impedance-matching arrangement includes a rotary or tapped coil which is coupled with a continuously variable capacitor to allow a mechanical adjustment of the reactive elements for permitting the matching of a generator source impedance to a range of terminating impedances. The above type of arrangement has the disadvantage in that the adjustment thereof, being manual and mechanical in nature, is quite slow due the inherent mechanical time constants of the arrangement. A very rapid reconfiguration of the arrangement so as to be used with different load impedances is not achievable since the mechanical components must vary through an initial setting to other settings. This limitation restricts the use of such an arrangement to quasistationary environments where, after an initial adjustment, the terminating impedance and operating frequency remains fixed for a relatively long period of time.

BRIEF SUMMARY OF THE INVENTION

In accordance with the present invention an impedance-matching network is provided which overcomes the types of prior art problems and difficulties as mentioned hereinabove. The impedance-matching network in accordance with the invention is employed to impedance match a source, such as a generator, to a load and includes a first plurality of reactive elements, for example, capacitors, and a second plurality of reactive elements, for example, inductors. A first control means is provided which operates selectively to connect one or more of the first plurality of reactive elements across a first pair of busses, thereby to achieve an effective first reactance across the first pair of busses, and also to selectively connect one or more of the second plurality of reactance elements across the second pair of busses, thereby to achieve an effective second reactance across the second pair of busses. The impedance-matching network further includes a second control means which is operative to interconnect a source to be impedance-matched with a load with the first and second pairs of busses having the effective reactances thereacross in any one of a plurality of different possible circuit configurations or topologies.

BRIEF DESCRIPTION OF THE DRAWING

Various objects, features and advantages of an impedance-matching network in accordance with the present invention will be apparent from the following detailed description taken in conjunction with the accompanying drawing in which.

DETAILED DESCRIPTION OF THE INVENTION

Figure 1:
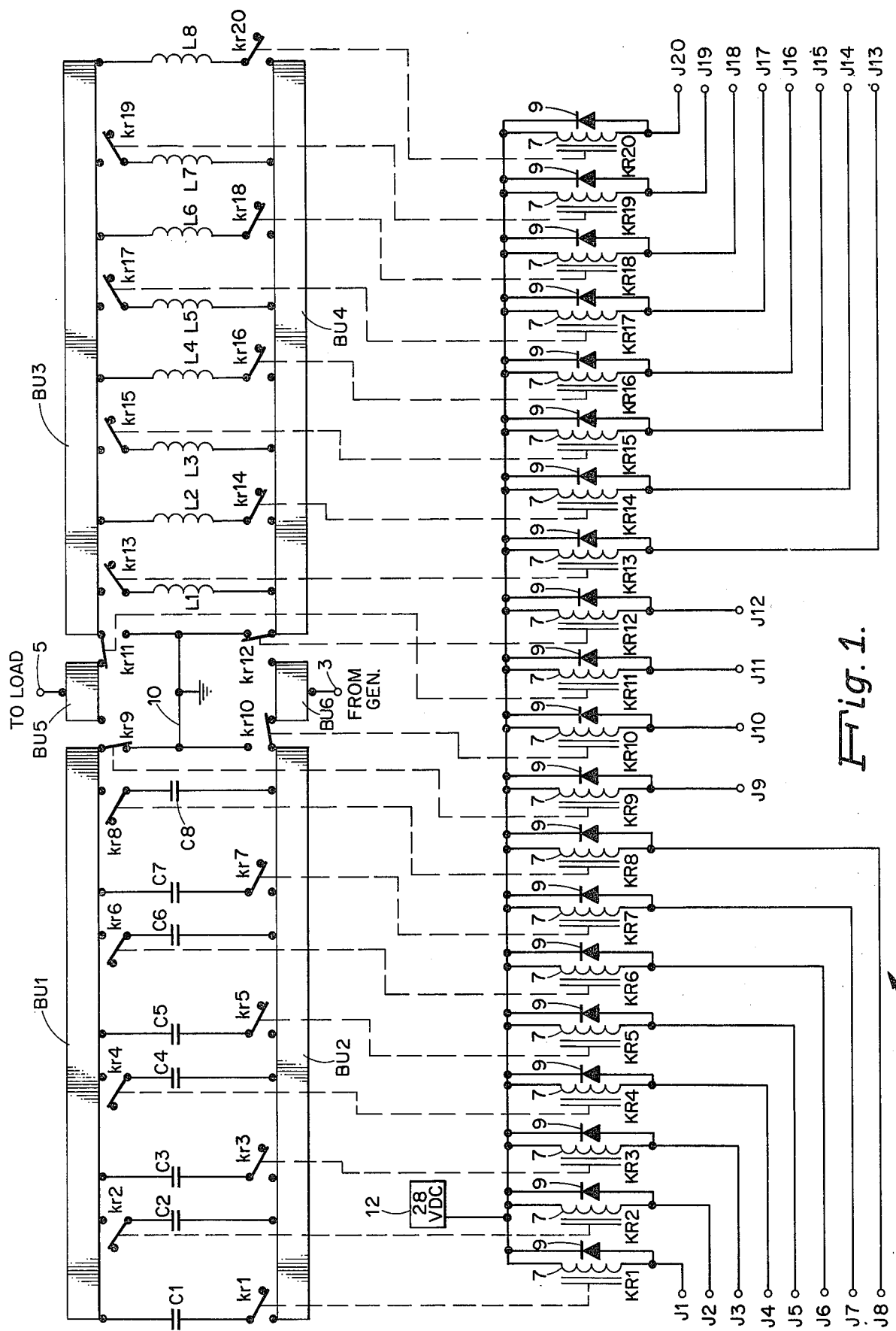
FIG. 1 is a schematic diagram of an impedance-matching network in accordance with the invention.

Referring now to FIG. 1, there is shown an impedance-matching network 1 in accordance with the present invention. The impedance-matching network 1 is connected between an input terminal 3 and an output terminal 5 and is adapted to impedance match a source such as a generator (not shown) connected to the input terminal 3 with a load (also not shown) connected to the output terminal 5. As will be described hereinafter, the impedance-matching network 1 may be controlled, specifically, by means of voltages established at a plurality of control terminals J1–J20, so as to have any one of four possible "L" configurations, as shown in FIGS. 5–8, and to have any one of several possible selected capacitive and inductive reactance values.

The impedance-matching network 1 as shown in FIG. 1 generally comprises a plurality of relays KR1–KR20 connected to the above-mentioned control terminals J1–J20, a plurality of capacitors C1–C8, and a plurality of inductors L1–L8. As will be explained more fully hereinafter, the particular relays KR1–KR8 are employed to establish a particular capacitive reactance for the network 1, the relays K13–K20 are employed to establish a particular inductive reactance for the network 1, and the relays KR9–KR12 are employed to establish the particular topology or configuration for the network 1, that is, to establish a particular one of the four possible L-type configurations as shown in FIGS. 2–5.

Each of the relays KR1–KR20, which may be of the vacuum type, includes a winding 7 which, when energized, causes a corresponding one of a plurality of movable contacts $kr1–kr20$ to move from a first, "open" position to a second, "closed" position. Diodes 9 are connected across the windings 7 for damping transients during energization of the windings 7. When one of the contacts $kr1–kr8$ is operated to its "closed" position in accordance with the invention, by virtue of the energization of the relay winding 7 of the corresponding one of the relays KR1–KR8, a corresponding one of the capacitors C1–C8 in series with the contact is caused to be connected across a first pair of busses BU1 and BU2. Similarly, when one of the contacts $kr13–kr19$ is operated to its "closed" position by virtue of the energization of the relay winding 7 of the corresponding one of the relays KR13–KR20, a corresponding one of the inductors L1–L8 in series with the contact is caused to be connected across a second pair of busses BU3 and BU4. Thus, by the selective energization of the windings 7 of the relays KR1-KR8 and KR13-KR20, one or more (or none) of the capacitors C1-C8 and inductors L1-L8 may be connected across the busses BU1-BU4 to establish the desired capacitance and inductance values for the network 1. The selective closure of the contacts $kr9-kr12$, by virtue of the selective energization of the windings 7 of the corresponding relays KR9-KR12, interconnects the capacitance and inductance portions of the network 1, by way of a third pair of busses BU5 and BU6, so that the overall configuration or topology for the network 1 assumes one of the forms as shown in FIGS. 2-5. The selective operation of the contacts $kr9-kr12$ further connects the selected capacitance (C) or inductance (L) of the network 1 to ground potential, in the manner shown in FIGS. 2-5, via a conductor arrangement 10 which is adapted to be selectively connected with the various busses BU1-BU6. As shown in FIG. 1, the busses BU5 and BU6 are connected, respectively, to the terminals 3 and 5 to which the generator and load are respectively connected. The various busses BU1-BU6 as described hereinabove are, in effect, unterminated transmission lines and have characteristic impedances selected so as to minimize parasitic reactances in the network 1. The busses BU1-BU6 may be implemented in practice by means of gold plated copper sheets.

The control of the windings 7 of the relays KR1-KR20 so that they are either energized or de-energized is accomplished in accordance with the present invention by the selective application of binary-related voltages to the terminals J1-J20. Specifically, to energize any one of the windings 7, the associated one of the control terminals J1-J20 is simply placed at ground potential. This operation causes a dc voltage source 12 (e.g., 28 volts d.c.), which is connected in common with all of the windings 7, to be connected via the selected winding 7 to ground potential, causing current to flow in the winding 7, thereby closing the associated one of the contacts $kr1-kr20$. To cause the winding 7 of any one of the relays KR1-KR20 to operate in its de-energized state, the associated one of the control terminals J1-J20 is simply isolated from ground potential. This operation prevents current from flowing from the dc voltage source 12 through the winding 7, thereby maintaining the winding in a de-energized state and keeping the associated contact in its open, or inactivated state. Thus, the voltage conditions established at the terminals J1-J20, by which certain ones of the terminals may be placed at ground potential and the other ones held at the 28 volt potential of the source 12, may be considered to be binary in nature, with the ground condition representing a binary "0", for example, and the 28 volt condition representing a binary "1".

In the operation of the network 1 as described hereinabove, the particular topology for the network 1 and the desired overall values of capacitance and inductance for the network 1 are selected by the appropriate control of the voltages at the control terminals J1-J20. Specifically, to select the desired overall capacitance for the network 1, the control terminals J1-J8 are selectively placed at ground potential (binary 0) or opened to 28 volts d.c. (binary 1) and, similarly, to select the desired overall inductance for the network 1, the control terminals J13-J20 are selectively placed at ground potential or opened to 28 volts d.c. The energization of the windings 7 of the relays KR1-KR8 causes corresponding ones of the capacitors C1-C8 to be connected in parallel across the busses BU1 and BU2, and, similarly, the energization of the windings 7 of the relays KR13-KR20 causes corresponding ones of the inductors L1-L8 to be connected in parallel across the busses BU3 and BU4.

Figure 2:
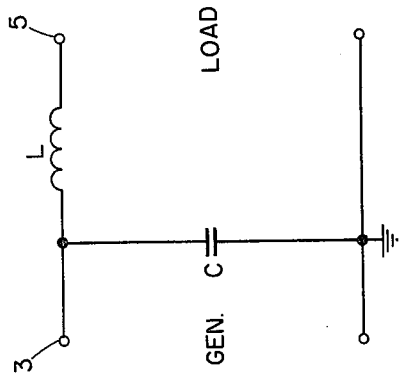
FIGS. 2–5 are schematic representations illustrating four possible L-type configurations or topologies for the impedance-matching network of FIG. 1.
Figure 3:
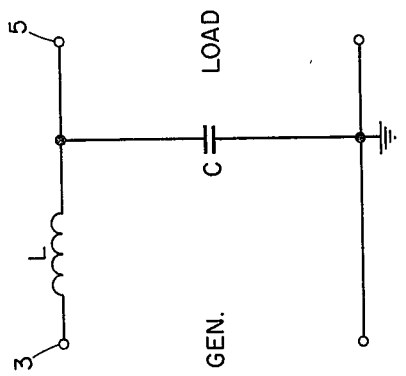
Figure 4:
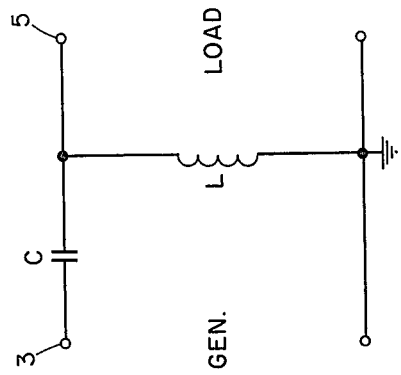
Figure 5:
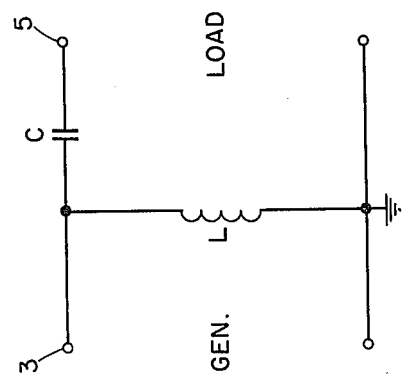
Figure 6:
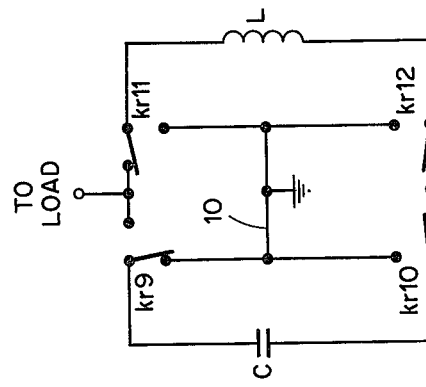
FIGS. 6–9 are schematic representations corresponding to FIGS. 5–8, respectively, and illustrating conditions of elements of the impedance-matching network for the four L-type configurations as shown in FIGS. 5–8.
Figure 7:
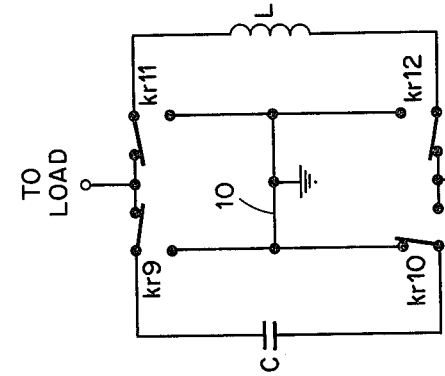
Figure 8:
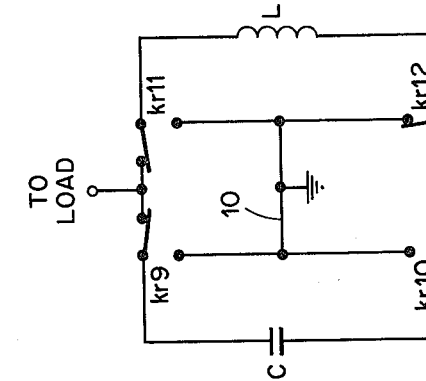
Figure 9:
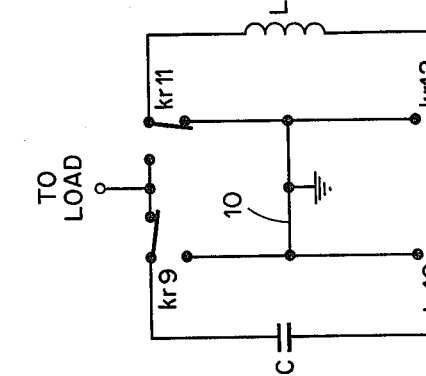

As previously indicated, there are four possible topologies or configurations (L-shaped) for the network 1, as shown in FIGS. 2-5. To arrange the network 1 to have the configuration as shown in FIG. 2, the terminals J9, J11 and J12 are placed at ground potential and the terminal J10 is placed at 28 volts d.c. The binary sequence for the terminals J9, J10, J11 and J12 is therefore 0100. With this binary sequence, the contacts $kr9-kr12$ have the positions as shown in FIG. 6 with the generator being connected across the selected value of inductance to ground potential, via the connector arrangement 10, and the load being in series with the selected value of capacitance. To arrange the network 1 to have the configuration as shown in FIG. 3, the terminal J9 is placed at ground potential and the terminals J10, J11 and J12 are placed at 28 volts d.c., representing a binary sequence for the terminals J9, J10, J11 and J12 of 0111. in this case, the contacts $kr9-kr12$ have the positions as shown in FIG. 7 with the generator being in series with the selected capacitance and the load connected across the selected inductance to ground potential via the connector arrangement 10. To arrange the network 1 to have the configuration as shown in FIG. 4, the terminals J9, J10 and J12 are placed at ground potential and the terminal J11 is placed at 28 volts d.c., representing a binary sequence for the terminals J9, J10, J11 and J12 of 0010. In this case, the contacts $kr9-kr12$ have the positions as shown in FIG. 8 with the generator being connected in series with the selected inductance and the load connected across the selected capacitance to ground potential via the connector arrangement 10. To arrange the network 1 to have the configuration as shown in FIG. 5, the terminals J9, J10 and J11 are placed at 28 volts d.c. and the terminal J12 is placed at ground potential, representing a binary sequence for the terminals J9, J10, J11 and J12 of 1110. In this case, the contacts $kr9-kr12$ have the positions as shown in FIG. 9 with the generator connected across the selected capacitance to ground potential, via the connector arrangement 10, and the load in series with the selected inductance.

In the above fashion, desired values of capacitance and inductance may be selected for the network 1 and interconnected into any one of the four possible configurations shown in FIGS. 2-5 and FIGS. 6-9. To change the values of capacitance and/or inductance and/or the configuration of the network 1, it is only required to change the set of voltages applied to the control terminals J1-J20. With vacuum-type relays KR1-KR20, this change can typically be accomplished in a time period less than 20 milliseconds.

One version of the network 1 as described hereinabove was constructed to have capacitors C1-C8 and inductors L1-L8 having the following values:

| | |
|---|---|
| C1 — 4pf | L1 — 0.10 uhy |
| C2 — 8pf | L2 — 0.18 uhy |
| C3 — 16pf | L3 — 0.31 uhy |
| C4 — 33pf | L4 — 0.54 uhy |
| C5 — 62pf | L5 — 0.94 uhy |
| C6 — 120pf | L6 — 1.64 uhy |
| C7 — 240pf | L7 — 2.86 uhy |
| C8 — 510pf | L8 — 5.00 uhy |

As is evident from the above listing, the values of the capacitors C1–C8 are essentially binarily-related in that the value of each capacitor is approximately twice the value of the preceding capacitor in the sequence (C1–C8) and, similarly, the values of the inductors L1–L8 are essentially binarily-related in that the value of each inductor is approximately twice the value of the preceding inductor in the sequence (L1–L8). The binary relationships are approximate to compensate for the presence of parasitic reactances in the network due to the presence of the various busses BU1–BU6. The range of capacitance values is approximately 250 to 1 and the range of inductance values is approximately 110 to 1, thereby establishing a wide range of operating frequencies for the network 1. A 30 mhz generator having a 50 ohm impedance was connected to the input terminal 3 of the network 1 and a load including a 308 pf capacitor connected through a 6.6 ohm resistance to ground potential was connected to the output terminal 5 of the network 1. To provide the desired impedance match, a set of voltages having binary values of 01011011111001110010 was established at the terminals J1–J20 of the network 1. The configuration shown in FIG. 5 was selected, by virtue of the 1110 binary values at terminals J9–J12, and the capacitors C1, C3 and C6 were connected in parallel across the busses BU1 and BU2 and the inductors L2, L5, L6 and L8 were connected in parallel across the busses BU3 and BU4. The effective value of discrete capacitance across the busses BU1 and BU2 was therefore 140 pf and the effective value of discrete inductance across the busses BU3 and BU4 was 0.135 uhy.

The network 1, having the aforementioned values for the capacitors C1–C8 and inductors L1–L8, may also be used to match the aforementioned 50 ohm generator source to a load up to a VSWR of 20 to 1 over a frequency range of 6 to 32 mhz at power levels exceeding 1000 watts. The amount of discrete capacitance may be varied from a minimum of 4pf to a maximum of 1000 pf (a range of 250 to 1) and the amount of inductance may be varied from a minimum of 0.044 to a maximum of 5.0 uhys (a range of approximately 110 to 1). Thus, the network 1 may be used to establish a large number of impedance matches in a rapid fashion and in any one of several (four) possible configurations.

While there has been described what is considered to be a preferred embodiment of the invention it will be obvious to those skilled in the art that various changes and modifications may be made therein without departing from the invention as called for in the appended claims.

What is claimed is:

1. An impedance-matching network for impedance-matching a source and a load, comprising:
   a first pair of busses;
   a second pair of busses;
   a first plurality of reactive elements;
   a second plurality of reactive elements;
   first control means operative selectively to connect one or more of the first plurality of reactive elements across the first pair of busses thereby to achieve an effective first reactance across the first pair of busses, and operative selectively to connect one or more of the second plurality of reactive elements across the second pair of busses thereby to achieve an effective second reactance across the second pair of busses; and
   second control means operative to interconnect the source and load with the first and second pairs of busses having the effective reactances thereacross in any one of a plurality of different possible circuit configurations.

2. An impedance-matching network in accordance with claim 1 wherein:
   the first plurality of reactance elements are capacitance elements; and
   the second plurality of reactance elements are inductance elements.

3. An impedance-matching network in accordance with claim 2 wherein:
   the values of capacitance elements are essentially binarily-related with the value of each capacitance element in the sequence of capacitance elements along the first pair of busses being approximately twice the value of the preceding capacitance element in the sequence; and
   the values of inductance elements are essentially binarily-related with the value of each inductance element in the sequence of inductance elements along the second pair of busses being approximately twice the value of the preceding inductance element in the sequence.

4. An impedance-matching network in accordance with claim 2 wherein:
   the second control means is operative to interconnect the source and load with the first and second pairs of busses having the effective reactances thereacross in any one of four possible L-type circuit configurations with one of the source and load being connected in series with one of the effective reactances and the other of the source and load being connected in parallel to a reference potential with the other effective reactance.

5. An impedance-matching network in accordance with claim 4 wherein:
   the first and second pairs of busses are unterminated transmission lines.

6. An impedance-matching network in accordance with claim 1 wherein:
   the first control means includes:
      a plurality of actuation means each associated with a different one of the first and second pluralities of reactive elements and each operable between first and second states, each of said actuation means being operable when in its first state to connect the associated reactive element across the associated pair of busses and when in its second state to disconnect the associated reactive element from across the associated pair of busses; and
      energizing means associated with each of the actuation means and operable to cause the associated actuation means to operate in its first or second state; and
   the second control means includes:
      a plurality of actuation means associated with the first and second pairs of busses and the source and load and each operable between a first state and a second state; and
      energizing means associated with the plurality of actuation means and operable to selectively cause the plurality of actuation means to operate in their first or second states to selectively interconnect the source and load with the first and second pairs of busses having the effective reactances thereacross in any one of a plurality of possible circuit configurations.

7. An impedance-matching network in accordance with claim 6 wherein:
the second control means further includes an interconnect arrangement associated with the plurality of actuation means of the second control means and operative to establish, for each of the plurality of possible circuit configurations, a different path to a reference potential for each of the plurality of acutation means.

8. An impedance-matching network in accordance with claim 7 wherein:
each of the energizing means of the first and second control means includes an electrical winding of a relay; and
each of the actuation means of the first and second control means includes a contact of a relay.

9. An impedance-matching network in accordance with claim 8 wherein:
the first plurality of reactive elements are capacitance elements; and
the second plurality of reactive elements are inductance elements.

10. An impedance-matching network in accordance with claim 9 wherein:
the second control means is operative to interconnect the load and source with the first and second pairs of busses having the effective reactances thereacross in any one of four possible L-type circuit configurations with one of the source and load being connected in series with one of the effective reactances and the other of the source and load being connected in parallel to the reference potential with the other effective reactance.

11. An impedance-matching network in accordance with claim 10 wherein:
the first and second pairs of busses are unterminated transmission lines.

12. An impedance-matching network in accordance with claim 11 wherein:
the values of capacitance elements are essentially binarily-related with the value of each capacitance element in the sequence of capacitance elements along the first pair of busses being approximately twice the value of the preceding capacitance element in the sequence; and
the values of inductance elements are essentially binarily-related with the value of each inductance element in the sequence of inductance elements along the second pair of busses being approximately twice the value of the preceding inductance element in the sequence.

13. An impedance-matching network in accordance with claim 12 wherein:
the values of the capacitance elements vary over a range of approximately 250 to 1; and
the values of the inductance elements vary over a range of approximately 110 to 1.

* * * * *